(12) United States Patent
Fritsch et al.

(10) Patent No.: US 9,666,278 B2
(45) Date of Patent: May 30, 2017

(54) CONTENT ADDRESSABLE MEMORY ARRAY COMPRISING GEOMETRIC FOOTPRINT AND RAM CELL BLOCK LOCATED BETWEEN TWO PARTS OF A CAM CELL BLOCK

(71) Applicant: International Business Machines Corporation, Armonk, NY (US)

(72) Inventors: Alexander Fritsch, Esslingen (DE); Werner Juchmes, Boeblingen (DE); Shankar Kalyanasundaram, Bangalore (IN); Rolf Sautter, Bondorf (DE)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 14/855,615

(22) Filed: Sep. 16, 2015

(65) Prior Publication Data

US 2016/0099053 A1    Apr. 7, 2016

(30) Foreign Application Priority Data

Oct. 2, 2014   (GB) .................................. 1417455.1

(51) Int. Cl.
    *G11C 15/00*    (2006.01)
    *G11C 15/04*    (2006.01)
(52) U.S. Cl.
    CPC ............. *G11C 15/04* (2013.01); *G11C 15/00* (2013.01)
(58) Field of Classification Search
    CPC ....... G11C 15/04; G11C 15/00; G11C 15/046; G11C 8/14; G11C 5/025; G06F 17/30982
    USPC .... 365/49.1, 51, 63, 189.07, 49.17; 711/108
    See application file for complete search history.

(56) References Cited

U.S. PATENT DOCUMENTS

| | | |
|---|---|---|
| 7,016,211 B2 | 3/2006 | Park et al. |
| 7,259,979 B2 | 8/2007 | Sachan et al. |
| 7,277,309 B1 | 10/2007 | Banachowicz et al. |
| 7,307,861 B1 | 12/2007 | Bettman et al. |

(Continued)

FOREIGN PATENT DOCUMENTS

| | | |
|---|---|---|
| CA | 2380343 C | 6/2012 |
| WO | 2008064172 A2 | 5/2008 |

OTHER PUBLICATIONS

Nii et al., "A 28nm 400MHz 4-Parallel 1.6Gsearch/s 80Mb Ternary CAM," 2014 IEEE International Solid-State Circuits Conference Digest of Technical Papers (ISSCC), Session 13, Advanced Embedded Memory, 13.6, Feb. 11, 2014, pp. 239-241, © 2014 IEEE. DOI: 10.1109/ISSCC.2014.6757417.

(Continued)

*Primary Examiner* — David Lam
(74) *Attorney, Agent, or Firm* — Jay Wahlquist

(57) ABSTRACT

A memory apparatus includes a content addressable memory, CAM, cell block including CAM cells and a random access memory (RAM), cell block including RAM cells. A geometric footprint of each of the CAM cells has a side bigger than a side of a geometric footprint of each of the RAM cells, where the sides of the CAM cells and the RAM cells are parallel to each other. The apparatus is configured to translate an input keyword at an input of the CAM cell block to an output word at an output of the RAM cell block when the keyword at the input of the CAM cell block is stored in the CAM cell block. The CAM cell block is split into a first part and a second part of the CAM cells.

20 Claims, 2 Drawing Sheets

(56) References Cited

U.S. PATENT DOCUMENTS

| | | | |
|---|---|---|---|
| 7,602,629 B2 * | 10/2009 | Wickeraad | G11C 15/04 365/49.1 |
| 8,355,269 B1 | 1/2013 | Zampaglione | |
| 8,582,338 B1 | 11/2013 | Argyres | |
| 2002/0105821 A1 | 8/2002 | Gray | |
| 2004/0061143 A1 | 4/2004 | Koolhaas et al. | |
| 2009/0040801 A1 | 2/2009 | Chai et al. | |
| 2013/0250642 A1 | 9/2013 | Gronlund et al. | |

OTHER PUBLICATIONS

Onizawa et al., "A Compact Soft-Error Tolerant Asynchronous TCAM Based on a Transistor/Magnetic-Tunnel-Junction Hybrid Dual-Rail Word Structure," 2014 20th IEEE International Symposium on Asynchronous Circuits and Systems (ASYNC), 2014, pp. 1-8, © 2014 IEEE. DOI: 10.1109/ASYNC.2014.9.

GB Application 1417455.1, entitled "Content Addressable Memory Array," filed Oct. 2, 2014, 25 pages.

* cited by examiner

CONTENT ADDRESSABLE MEMORY ARRAY COMPRISING GEOMETRIC FOOTPRINT AND RAM CELL BLOCK LOCATED BETWEEN TWO PARTS OF A CAM CELL BLOCK

BACKGROUND

Content addressable memory arrays are widely used in applications where extremely fast searching of data is required. For instance, these arrays may be used for fast addressing of a database. Content addressable memory arrays can compare an input search data (tag) against a table of stored data and return an address of a matching data in the database. In contrast to dynamic random access memory (DRAM), where each cell consists of a single transistor and a single capacitor, the content addressable memory arrays include a whole set of transistors performing data write and data compare functions in parallel. Further, the memory cells of the content addressable memory arrays are united by a plurality of various logical gates for performing logical functions on match results generated by each of the content addressable memory cells. Thus, in contrast to DRAM memory the content addressable memory arrays require optimum layout of various components of these arrays.

SUMMARY

The present invention provides for embodiments that fill the need of providing a fast operating content addressable memory array having compact layout, a method for operating the array, and a hardware description language (HDL) design structure encoded on a machine-readable data storage medium, wherein the HDL design structure comprises elements which, when processed in a computer-aided design system, generate a machine-executable representation of the content addressable memory array.

One embodiment provides for a memory apparatus comprising a content addressable memory, CAM, cell block comprising CAM cells and a random access memory, RAM, cell block comprising RAM cells. A geometric footprint of each of the CAM cells has a side bigger than a side of a geometric footprint of each of the RAM cells, wherein the sides of the CAM cells and the RAM cells are parallel to each other. The apparatus is configured to translate an input keyword at an input of the CAM cell block to an output word at an output of the RAM cell block when the keyword at the input of the CAM cell block is stored in the CAM cell block. The CAM cell block is split into a first part and a second part of the CAM cells. The RAM cell block is located between the first part and the second part of the CAM cells with the first part and a second part of the CAM cells being coupled to the corresponding RAM cells in an alternating manner via respective word lines.

Another embodiment provides for a hardware description language, HDL, design structure encoded on a machine-readable data storage medium, the HDL design structure comprising elements that when processed in a computer-aided design system generates memory apparatus comprising a content addressable memory, CAM, cell block comprising CAM cells and a random access memory, RAM, cell block comprising RAM cells. A geometric footprint of each of the CAM cells has a side bigger (e.g., longer) than a side of a geometric footprint of each of the RAM cells, wherein the sides of the CAM cells and the RAM cells are parallel to each other. The apparatus is configured to translate an input keyword at an input of the CAM cell block to an output word at an output of the RAM cell block when the keyword at the input of the CAM cell block is stored in the CAM cell block. The CAM cell block is split into a first part and a second part of the CAM cells. The RAM cell block is located between the first part and the second part of the CAM cells with the first part and a second part of the CAM cells being coupled to the corresponding RAM cells in an alternating manner via respective word lines.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
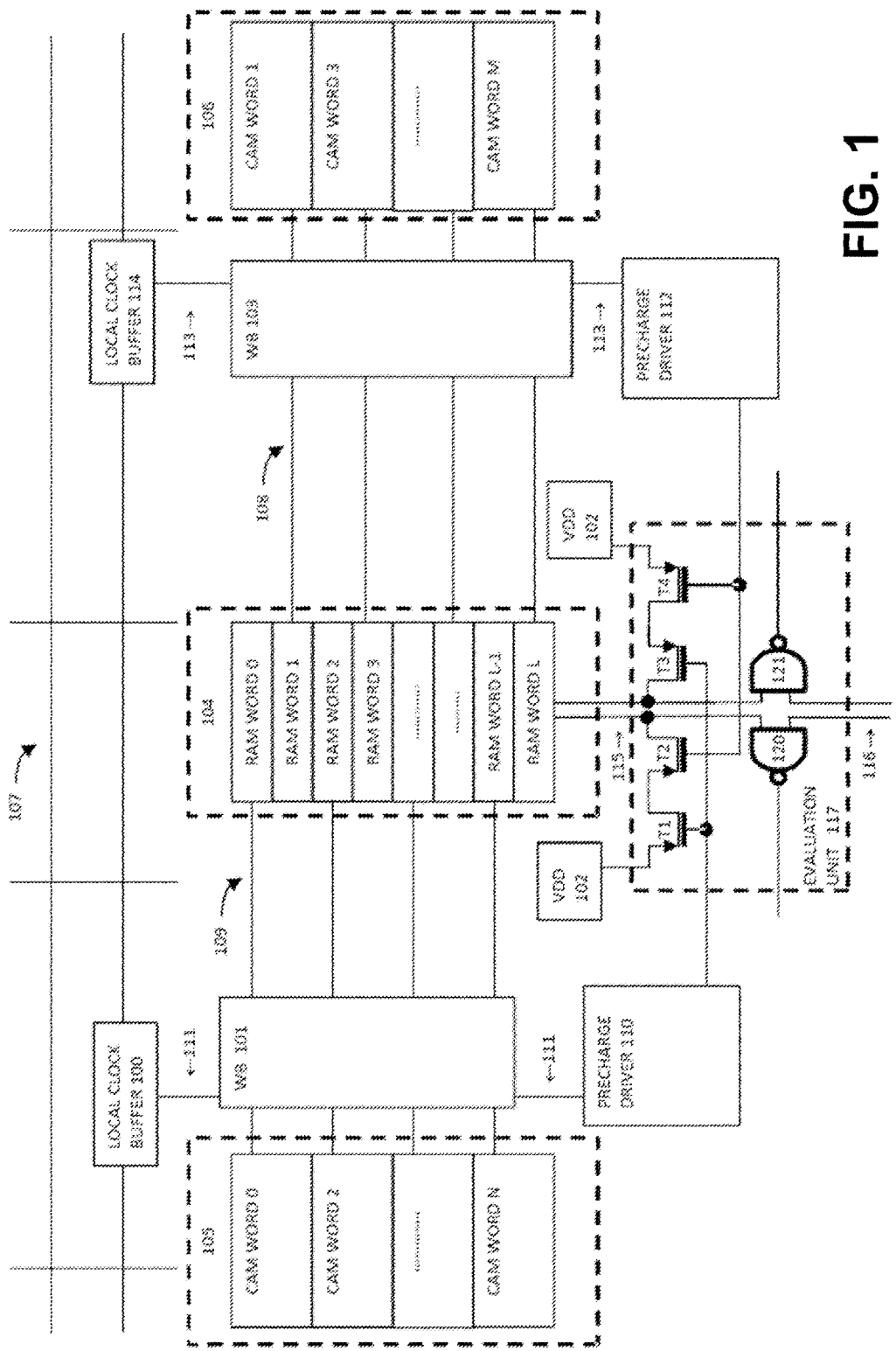
FIG. 1 illustrates a circuit diagram of a content addressable memory array.

While embodiments described herein are amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Utilization of modern manufacturing technologies for production of content addressable memory arrays operating at ever-increasing clock frequencies requires device architectures with advanced layout, e.g., further optimization of allocation of different units of the content addressable memory arrays and new solutions for wiring between these units. The present disclosure addresses this problem. It may provide for a reduced geometrical footprint of the content addressable memory array and enables utilization of strait wiring between columns of content addressable memory (CAM) cells being logical words of one or more CAM cell blocks of the content addressable memory array and columns of static memory random access (SRAM) cells being logical words of one or more random access (RAM) blocks of the content addressable memory array. As a result, the strait wiring can be implemented in a single wiring layer, enabling operation of the content addressable memory array at higher clock frequencies and reduction of its geometrical footprint.

In another embodiment the side of the geometric footprint of each of the CAM cells is twice bigger (e.g., longer) than the side of the geometric footprint of each of the RAM cells. In addition this compact layout enables power saving during operation of the content addressable memory array, because of simplified structure of critical wiring layers like word lines coupling the CAM cell block to the RAM cell block.

This feature enables compact layout of components of the content addressable memory array and as a result thereof, an increase of clock frequency of the content addressable memory array.

In another embodiment the geometric footprint of each of the CAM cells has further another side being equal to another side of the geometric footprint of each of the RAM cells.

In another embodiment, the memory apparatus further comprises bit lines and an evaluation unit. The bit lines are coupled to the output of the RAM cell block. The word lines are adapted for transmitting a match signal from the first or the second part of the CAM cells to the respective RAM cells synchronized with a first and a second clock signals, respectively. The match signal indicates that the keyword at the input of the first or second CAM cell block is stored in the first or second CAM cell block. The evaluation unit is adapted for receiving both clock signals.

The apparatus is configured to activate a read coupling of each of a respective subset of the RAM cells to the respective bit line of the RAM cells in response to receiving the match signal from the first or the second part of the CAM cells.

The evaluation unit is configured for precharging the bit lines before the activation of the read coupling of the subset of the RAM cells. The read coupling is deactivated during the precharging of the bit lines. The precharging of the bit lines is terminated synchronized with another clock signal generated by applying OR logical function to the first and second clock signal.

This embodiment will provide a solution for eliminating of a phase jitter between the first and the second clock signals, which are driving in parallel the deactivation of the precharging of the bit lines. Synchronization of the read coupling activation with the deactivation of the precharging of the bit lines is one of the aspects of content addressable memory arrays having clock frequencies in a gigahertz (GHz) range.

In another embodiment, each of the RAM cells of the subset is coupled to the respective bit line via a respective world line gate when the read coupling is activated.

In another embodiment wherein the first and the second clock signals have the same frequency.

In another embodiment, the first and the second clock signal are generated by different local clock buffers coupled to the same clock grid.

In another embodiment, the bit lines are coupled to read amplifiers of the evaluation unit.

In another embodiment, the bit lines are coupled to the read amplifiers via NAND gates of the evaluation unit.

In another embodiment, each of the RAM cells is configured to: store either a first logical value or a second logical value, discharge the precharged bit line when the activation of the read coupling results in a coupling of the precharged bit line to the each of the RAM cells having the first logical value stored therein; and retain a charge of the precharged bit line when the activation of the read coupling results in a coupling of the precharged bit line to the each of the RAM cells cell having the second logical value stored therein.

In another embodiment, the evaluation circuit further includes at least one p-FET stack per bit line, wherein each of the p-FET stacks couples the respective bit line to power and is adapted to perform the OR logical function, wherein a gate terminal of a first one of the transistors of each of the p-FET stacks is coupled to the first clock signal and configured to be closed by a pulse of the first clock signal, wherein a gate terminal of a second one of the transistors of each of the p-FET stacks is coupled to the second clock signal and configured to be closed by a pulse of the second clock signal.

This embodiment may disclose an effective hardware solution for elimination of the aforementioned phase jitter problem. Only one extra transistor may be used per bit line in order to provide jitter free precharging of bit lines and enable margin free timing relationship between activation of the read coupling and deactivation of the precharging of the bit lines.

In another embodiment, the memory apparatus further comprises a first and a second world line buffer. The first and the second part of the CAM cells are coupled to the corresponding RAM cells via the first and the second world line buffers, respectively. The first and the second word line buffers are configured to synchronize the match signals from the first and second part of the CAM cells to the corresponding RAM cells with the first and second clock signal, respectively.

FIG. 1 illustrates a circuit diagram of a content addressable memory array. The content addressable memory array is configured to translate an input keyword at an input of a CAM cell block 105, 106 to an output word at an output of a RAM cell block 104, when the keyword at the input of the CAM cell block is stored in the CAM cell block. The CAM cell block comprises a first part of the CAM cell block 105 and a second part of the CAM cell block 106. Each of the parts comprises subsets of CAM cells being logical words of the CAM cell block.

The subsets of the first part of the CAM cell block are depicted on the FIG. 1 as "CAM WORD 0", "CAM WORD 2", . . . , "CAM WORD N". The subsets of the second part of the CAM cell block are depicted on the FIG. 1 as "CAM WORD 1", "CAM WORD 3" . . . "CAM WORD M". Each of the CAM cell subsets is configured to store one keyword.

The RAM cell block comprises subsets of the RAM cells being logical words of the CAM cell block. The subsets of the CAM cell block are depicted on the FIG. 1 as "RAM WORD 0", "RAM WORD 1", "RAM WORD 2", "RAM WORD 3", . . . , "RAM WORD L-1", "RAM WORD L". Each of the words of the CAM cell block has a logical and communicative coupling with the respective word of the RAM cell block. The communicative coupling between the first part of the CAM cell block 105 and the RAM cell block 104 comprises word lines 109 and a word line buffer 101.

The communicative coupling between the second part of the CAM cell block 106 and the RAM cell block 104 comprises word lines 108 and a word line buffer 103. Even cells of the RAM block are communicatively coupled with the respective CAM cells of the first part of the CAM cell block and odd cells of the RAM block are communicatively coupled with the respective CAM cells of the second part of the CAM cell block as depicted on the FIG. 1.

This way of communicative coupling enables implementation of strait wiring lines of the communicative coupling. Such a layout, when the CAM cell block is allocated between the first and the second part of the CAM cell block, is based on configuration of CAM cells and RAM cells. The CAM cell block comprises the CAM cells based on a couple of static memory cells, while the RAM cell block comprises RAM cells based on one static memory cells, wherein the static memory cells of CAM cell block and RAM cell block have the same type and a geometrical footprint.

As a result thereof one of the sides of the geometrical footprint of the CAM cell is twice bigger than one of the sides of the geometrical footprint of the RAM cell block. Parallel orientation of these sides with respect to each other on a chip comprising the content addressable memory array enables implementation of strait wiring between the respective words of the CAM cell array and the RAM cell array. In this case, one side of the geometrical footprint of each of the CAM words of the first (second) part of the CAM cell array is allocated abreast one side of a geometrical footprint of the respective pair of RAM words and communicatively coupled to one of the RAM words of the pair.

The CAM cells and the RAM cells may be further configured in a way that their geometrical footprints may have equal sides. This configuration may further enable effective utilization/reduction of area of the chip comprising the content addressable memory array. The static memory cells used for the CAM and RAM cells may be for instance 6 transistor or 8 transistor static memory cells.

The basic principle of functioning of the addressable memory array is based on the following steps: A key word is received at the input of the CAM block. When a keyword in stored in one of the words of the CAM block then a match signal is sent via the respective word line to the RAM cells of the respective RAM word. The match signal causes activation of a read coupling comprising communicative coupling between data output terminals of the CAM cells of the RAM word and the bit lines 115 of the RAM block.

The data output terminal of each of the RAM cells is configured to output data stored in the each of the RAM cells. As a result thereof data stored in the RAM word is generated on the output (the bit lines) of the RAM block. For instance, if a keyword at the input of the CAM block matches a word stored in the CAM word marked as "CAM WORD 0 "on the FIG. 1 then a match signal is sent via the respective word line 109 to the RAM cells marked as "RAM WORD 0" on the FIG. 1. In its own turn the match signal activates coupling between data output ports of the RAM cells of the "RAM WORD 0" and the bit lines 115. As a result thereof data stored in the RAM cells of the "RAM WORD 0"is generated at the output of the RAM block (the bit lines 115).

The content addressable memory array may further comprise a clock signal grid 107 comprising a local clock buffer 100 and a local clock buffer 114. The local clock buffer 100 and the local clock buffer 114 generate a first and a second clock signals, respectively. The first and the send clock signals have the same frequency and phase jitter with respect to each other. The reason for the phase jitter may be independent and thus different signal propagation times may of the clock signals on their respective signal lines.

The first word line buffer 101 and a first precharge generator 110 are configured to receive the first clock signal of the local clock buffer 100 via a communicative coupling 111. The second word line buffer 103 and a second precharge generator 112 are configured to receive the second clock signal of the local clock buffer 114 via a communicative coupling 113. The first and the second word line buffers are configured to synchronize the match signals from the first and second part of the CAM cells to the corresponding RAM cells with the first and second clock signal, respectively.

The content addressable memory array further comprises an evaluation unit 117. The valuation unit comprises at least one p-FET stack T1 and T2, T3 and T4 per bit line 115, wherein each of the p-FET stacks couples the respective bit line 115 to power (VDD) 102 and is adapted to perform OR logical function on the first and second clock signals received from the first and the second precharge generator, respectively.

A gate terminal of a first one of the transistors T1 and T3 of each of the p-FET stacks is coupled to the first clock signal and configured to be closed by a pulse of the first clock signal. A gate terminal of a second one of the transistors T2 and T4 of each of the p-FET stacks is coupled to the second clock signal and configured to be closed by a pulse of the second clock signal. The p-FET stacks perform precharging of bit lines in between time intervals when data words stored in the RAM cell block are outputted at the output (the bit lines 115) of the RAM block in response to matches of the respective words stored in the CAM cell block with the input keywords.

It may be advantageous to synchronize operation of p-FET stacks with both of the clock signals, since a match signal may be generated by either the first part of the CAM cell block or by the second part of the CAM cell block and as a result thereof it will be synchronized by the respective word line buffer with either the first clock signal or the second clock signal, respectively. In other words p-FET stacks enable timely decoupling of the bit lines 115 from the power 102 independent of the fact that the match signal is synchronized with the first clock signal or the second clock signal, e.g., influence of phase jitter between the first and the second clock signal on decoupling of the bit lines from the power is eliminated.

The first word line buffer 101 and the first precharge driver 110 may be configured to provide a phase shift between triggering of a transmission of the match signal (word line signal) to the RAM block and the first clock signal and/or a phase shift between the first clock signal received by the first precharge generation 110 via the communicative coupling 111 and the first clock signal forwarded to gate terminals of p-FET stacks. Optimal configuration of the first word line buffer and/or the first precharge driver enables optimization of the phase shift(s) for further increasing frequency of the clock signal without causing failure in operation of the content addressable memory array. The same approach is valid for the second word line buffer and the second precharge driver.

Each of the RAM cells is configured to: store either a first logical value or a second logical value; discharge (pull down) the precharged bit line when activation of the read coupling results in a coupling of the precharged bit line to the data output terminal of the each of the RAM cells having the first logical value stored therein; and retain a charge of the precharged bit line when activation of the read coupling results in a coupling of the precharged bit line to the data output terminal of the each of the RAM cells cell having the second logical value stored therein. The first logical value may be "1" and the second logical value may be "0" or the other way around.

The evaluation unit 117 may further comprise one or more NAND gates 120, 121 and/or one or more sense amplifiers. One or more bit lines 115 may be coupled to input terminals of the sense amplifiers each. One or more bit lines 115 may be coupled to input terminals of NAND gates 120, 121 each. Output terminals of NAND gates may be coupled to input terminals of the sense amplifiers each. Input terminals of one or more NAND gates 120, 121 may be coupled to one or more other bit lines each, wherein the other bit lines are output bit lines of another content addressable memory array. The NAND gate(s) may be further used for decoding of information stored in the RAM cell array. The sense amplifier(s) may be used for improvement of communication between the content addressable memory array and other content addressable memory arrays or other units of a chip.

Figure 2:
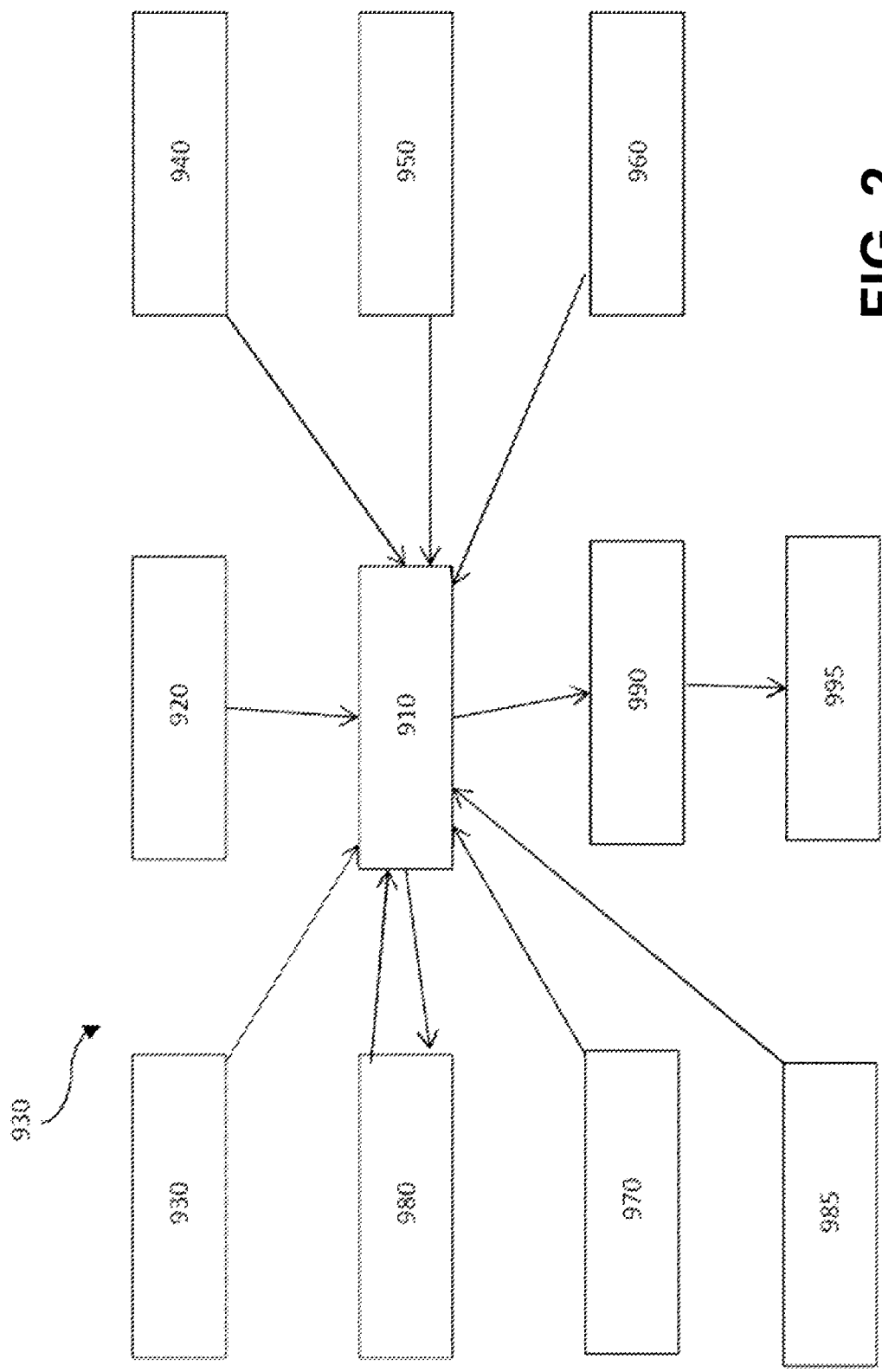
FIG. 2 illustrates a flow diagram of a design process used in semiconductor design, manufacture, and/or test.

FIG. 2 is a flow diagram of a design process used in semiconductor design, manufacture, and/or test. FIG. 2 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIG. 1. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 2 illustrates multiple such design structures including an input design structure 920 that may be processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as this shown in FIG. 1. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 may employ and incorporate hardware and/or software modules for synthesizing, translating, or otherwise processing a design/simulation functional equivalent of the components, circuits, devices, or logic structure shown in FIG. 1 to generate a netlist 980, which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985, which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the disclosure. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 920, design structure 990 may comprise one or more files, data structures, or other computer-encoded data or instructions that reside on transmission or data storage media and that when processed by an ECAD system generate a logically or otherwise functionally equivalent form of one or more of the embodiments shown in FIG. 1. In one embodiment, design structure 990 may comprise a compiled, executable HDL simulation model that functionally simulates the devices shown in FIG. 1.

Design structure 990 may also employ a data format used for the exchange of layout data of integrated circuits and/or symbolic data format (e.g., information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The present disclosure may describe a system, a method, and/or a computer program product at any possible technical detail level of integration. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A memory apparatus, comprising:
a content addressable memory (CAM), a cell block comprising CAM cells, and a random access memory (RAM), the cell block including RAM cells; and
a geometric footprint of each of the CAM cells having a side bigger than a side of a geometric footprint of each of the RAM cells, wherein the sides of the CAM cells and the RAM cells are parallel to each other;
the apparatus being configured to translate an input keyword at an input of the CAM cell block to an output word at an output of the RAM cell block when the keyword at the input of the CAM cell block is stored in the CAM cell block;
the CAM cell block being split into a first part and a second part of the CAM cells;
the RAM cell block being located between the first part and the second part of the CAM cells with the first part and a second part of the CAM cells being coupled to the corresponding RAM cells in an alternating manner via respective word lines.

2. The memory apparatus of claim 1, wherein the side of the geometric footprint of each of the CAM cells is at least twice as big the side of the geometric footprint of each of the RAM cells.

3. The memory apparatus of claim 1, wherein the geometric footprint of each of the CAM cells further comprises another side being equal to another side of the geometric footprint of each of the RAM cells.

4. The memory apparatus of claim 1, the memory apparatus further comprising:
bit lines, the bit lines being coupled to the output of the RAM cell block, the word lines being adapted for transmitting a match signal from the first or the second part of the CAM cells to the respective RAM cells synchronized with a first and a second clock signals, respectively, the match signal indicating that the keyword at the input of the first or second CAM cell block is stored in the first or second CAM cell block;
an evaluation unit, the evaluation unit being adapted for receiving both clock signals;
the apparatus being configured to activate a read coupling of each of a respective subset of the RAM cells to the respective bit line of the RAM cells in response to receiving the match signal from the first or the second part of the CAM cells;
the evaluation unit being configured for precharging the bit lines before the activation of the read coupling of the subset of the RAM cells, wherein the read coupling is deactivated during the precharging of the bit lines, wherein the precharging of the bit lines is terminated synchronized with another clock signal generated by applying OR logical function to the first and second clock signal.

5. The memory apparatus of claim 4, wherein the first and the second clock signals have the same frequency.

6. The memory apparatus of claim 4, wherein the bit lines are coupled to read amplifiers of the evaluation unit.

7. The memory apparatus of claim 6, wherein the bit lines are coupled to the read amplifiers via NAND gates of the evaluation unit.

8. The memory apparatus of claim 4, wherein each of the RAM cells is configured to:
store either a first logical value or second logical value;
discharge the precharged bit line when the activation of the read coupling results in a coupling of the precharged bit line to the each of the RAM cells having the first logical value stored therein; and
retain a charge of the precharged bit line when the activation of the read coupling results in a coupling of the precharged bit line to the each of the RAM cells cell having the second logical value stored therein.

9. The memory apparatus of claim 4, the evaluation circuit further comprising at least one p-FET stack per bit line, wherein each of the p-FET stacks couples the respective bit line to power and is adapted to perform the OR logical function;

wherein a gate terminal of a first one of the transistors of each of the p-FET stacks is coupled to the first clock signal and configured to be closed by a pulse of the first clock signal;

wherein a gate terminal of a second one of the transistors of each of the p-FET stacks is coupled to the second clock signal and configured to be closed by a pulse of the second clock signal.

10. The memory apparatus of claim 4, the memory apparatus further comprising:

a first and a second world line buffer, wherein the first and the second part of the CAM cells are coupled to the corresponding RAM cells via the first and the second world line buffers, respectively, the first and second word line buffers being configured to synchronize the match signals from the first and second part of the CAM cells to the corresponding RAM cells with the first and second clock signal, respectively.

11. A hardware description language (HDL), design structure encoded on a machine-readable data storage medium, the HDL design structure comprising elements that when processed in a computer-aided design system generates a machine-executable representation of a memory apparatus comprising: a content addressable memory (CAM), a cell block including CAM cells and a random access memory (RAM), the cell block including RAM cells; and a geometric footprint of each of the CAM cells having a side bigger than a side of a geometric footprint of each of the RAM cells, wherein the sides of the CAM cells and the RAM cells are parallel to each other;

the apparatus being configured to translate a input keyword at an input of the CAM cell block to an output word at an output of the RAM cell block when the keyword at the input of the CAM cell block is stored in the CAM cell block;

the CAM cell block being split into a first part and a second part of the CAM cells;

the RAM cell block being located between the first part and the second part of the CAM cells with the first part and a second part of the CAM cells being coupled to the corresponding RAM cells in an alternating manner via respective word lines.

12. The HDL structure of claim 11, wherein the side of the geometric footprint of each of the CAM cells is at least twice as big the side of the geometric footprint of each of the RAM cells.

13. The HDL structure of claim 11, wherein the geometric footprint of each of the CAM cells further comprises another side being equal to another side of the geometric footprint of each of the RAM cells.

14. The HDL structure of claim 11, wherein the machine-executable representation of the memory apparatus further comprises:

bit lines, the bit lines being coupled to the output of the RAM cell block, the word lines being adapted for transmitting a match signal from the first or the second part of the CAM cells to the respective RAM cells synchronized with a first and a second clock signals, respectively, the match signal indicating that the keyword at the input of the first or second CAM cell block is stored in the first or second CAM cell block;

an evaluation unit, the evaluation unit being adapted for receiving both clock signals;

the apparatus being configured to activate a read coupling of each of a respective subset of the RAM cells to the respective bit line of the RAM cells in response to receiving the match signal from the first or the second part of the CAM cells;

the evaluation unit being configured for precharging the bit lines before the activation of the read coupling of the subset of the RAM cells, wherein the read coupling is deactivated during the precharging of the bit lines, wherein the precharging of the bit lines is terminated synchronized with another clock signal generated by applying OR logical function to the first and second clock signal.

15. The HDL structure of claim 14, wherein the first and the second clock signals have the same frequency.

16. The HDL structure of claim 14, wherein the bit lines are coupled to read amplifiers of the evaluation unit.

17. The HDL structure of claim 16, wherein the bit lines are coupled to the read amplifiers via NAND gates of the evaluation unit.

18. The HDL structure of claim 14, wherein each of the RAM cells is configured to:

store either a first logical value or second logical value;

discharge the precharged bit line when the activation of the read coupling results in a coupling of the precharged bit line to the each of the RAM cells having the first logical value stored therein; and retain a charge of the precharged bit line when the activation of the read coupling results in a coupling of the precharged bit line to the each of the RAM cells cell having the second logical value stored therein.

19. The HDL structure of claim 14, wherein the machine-executable representation of the memory apparatus further comprises at least one p-FET stack per bit line, wherein each of the p-FET stacks couples the respective bit line to power and is adapted to perform the OR logical function;

wherein a gate terminal of a first one of the transistors of each of the p-FET stacks is coupled to the first clock signal and configured to be closed by a pulse of the first clock signal;

wherein a gate terminal of a second one of the transistors of each of the p-FET stacks is coupled to the second clock signal and configured to be closed by a pulse of the second clock signal.

20. The HDL structure of claim 14, wherein the machine-executable representation of the memory apparatus further comprises:

a first and a second world line buffer, wherein the first and the second part of the CAM cells are coupled to the corresponding RAM cells via the first and the second world line buffers, respectively, the first and second word line buffers being configured to synchronize the match signals from the first and second part of the CAM cells to the corresponding RAM cells with the first and second clock signal, respectively.

* * * * *